(12) United States Patent
Zuniga (10) Patent No.: US 7,615,822 B1
(45) Date of Patent: Nov. 10, 2009

(54) DIFFUSED DRAIN TRANSISTOR

(75) Inventor: Marco A. Zuniga, Dublin, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 0 days.

(21) Appl. No.: 10/327,794

(22) Filed: Dec. 23, 2002

(51) Int. Cl.
*H01L 29/78* (2006.01)

(52) U.S. Cl. ............... 257/336; 257/335; 257/E29.268; 257/E29.278

(58) Field of Classification Search .......... 257/288, 257/327, 335–338, 340, 342–351, 408, E21.435, 257/E21.437, E29.266, E29.268, E29.278
See application file for complete search history.

(56) References Cited

U.S. PATENT DOCUMENTS

| | | | | |
|---|---|---|---|---|
| 4,769,686 | A | * | 9/1988 | Horiuchi et al. ............ 257/373 |
| 5,053,838 | A | * | 10/1991 | Fujihira ..................... 257/338 |
| 5,151,759 | A | * | 9/1992 | Vinal ........................ 257/348 |
| 5,275,961 | A | * | 1/1994 | Smayling et al. ........... 438/286 |
| 5,349,225 | A | * | 9/1994 | Redwine et al. ............ 257/336 |
| 5,438,220 | A | * | 8/1995 | Nakagawa et al. ......... 257/487 |
| 5,525,822 | A | * | 6/1996 | Vinal ........................ 257/344 |
| 5,714,784 | A | * | 2/1998 | Ker et al. .................. 257/360 |
| 5,834,851 | A | * | 11/1998 | Ikeda et al. .................. 257/69 |
| 5,953,616 | A | * | 9/1999 | Ahn .......................... 438/305 |
| 5,955,746 | A | * | 9/1999 | Kim ............................ 257/69 |
| 5,998,274 | A | * | 12/1999 | Akram et al. .............. 438/306 |
| 6,022,770 | A | * | 2/2000 | Hook et al. ................ 438/211 |
| 6,078,082 | A | * | 6/2000 | Bulucea .................... 257/345 |
| 6,142,375 | A | * | 11/2000 | Belka et al. ............... 235/454 |
| 6,225,176 | B1 | * | 5/2001 | Yu ............................ 438/305 |
| 6,489,209 | B1 | * | 12/2002 | Shimoji .................... 438/305 |
| 6,518,835 | B2 | | 2/2003 | Riho et al. |
| 6,538,288 | B2 | | 3/2003 | Lee et al. |
| 6,563,175 | B2 | | 5/2003 | Shiau et al. |
| 6,677,210 | B1 | * | 1/2004 | Hebert ...................... 438/301 |
| 6,831,332 | B2 | * | 12/2004 | D'Anna et al. ............ 257/343 |

(Continued)

FOREIGN PATENT DOCUMENTS

JP 4-208571 * 7/1992 ............... 257/408

OTHER PUBLICATIONS

Webster's Collegiate Dictionary, 10th Edition, Springfield, Massachusetts (1999), p. 222.*

(Continued)

*Primary Examiner*—Allan R. Wilson
(74) *Attorney, Agent, or Firm*—Fish & Richardson P.C.

(57) ABSTRACT

A transistor has a source that includes a first impurity region with a first volume and a first surface area on a surface of the transistor. The transistor also has a drain that includes a second impurity region with a second volume and a second surface area on a surface of the transistor, a third impurity region with a third volume that overlaps and extends deeper than the second volume of the second impurity region, and a fourth impurity region with a fourth volume and a third surface area. The third surface area is located in the second surface area of the second impurity region. Additionally, the second and third impurity regions have a lower concentration of impurities than the fourth impurity region. The transistor also has a gate to control a depletion region between the source and the drain.

18 Claims, 7 Drawing Sheets

U.S. PATENT DOCUMENTS

| | | | |
|---|---|---|---|
| 2001/0020731 A1* | 9/2001 | Takamura | 257/621 |
| 2002/0109184 A1* | 8/2002 | Hower et al. | 257/335 |
| 2003/0122160 A1* | 7/2003 | Houston et al. | 257/207 |

OTHER PUBLICATIONS

S. Wolf, "Silicon Processing in the VLSI Era", vol. 3—The Submicron MOSFET, Lattice Press, Sunset Beach, California (1995), pp. 591-592 (section 9.6).*

Wolf, SW., "Silicon Processing for the VLSI Era", vol. 3—The submicron MOSFET, Lattice Press, Sunset Beach, California 1995 (ISBN o-961672-5-3), pp. 591-593.*

S. Wolf, "Silicon Processing for the VLSI Era", vol. 2—Process Integration, p. 662; Lattice Press, Sunset Beach, CA 90742 (ISBN: 0-961672-4-5) (1990).*

Wolf, S., "Silicon Processing for the VLSI Era", vol. 3—The submicron MOSFET, Lattice Press, Sunset Beach, CA (USA) (1995), pp. 136-137.*

Wolf et al, "Silicon Processing for the VLSI Era", vol. 1—"Process Technology", Second Edition, Lattice Press, Sunset Beach, CA (USA) (ISBN: 0-961672-6-1) (2000), pp. 376-378 and 807-809.*

Wolf, S., "Silicon Processing for the VLSI Era", vol. 3—"The submicron MOSFET", Lattice Press, Sunset Beach, CA (USA) (ISBN: 0-961672-5-3) (1995), pp. 586-592.*

* cited by examiner

DIFFUSED DRAIN TRANSISTOR

BACKGROUND

The present invention relates generally to transistors, such as transistors with diffused drains used in switching regulators.

Voltage regulators, such as DC to DC converters, are used to provide stable voltage sources for electronic systems. Efficient DC to DC converters are particularly needed for battery management in low power devices, such as laptop notebooks and cellular phones. Switching voltage regulators (or simply "switching regulators") are known to be an efficient type of DC to DC converter. A switching regulator generates an output voltage by converting an input DC voltage into a high frequency voltage, and filtering the high frequency input voltage to generate the output DC voltage. Specifically, the switching regulator includes a switch for alternately coupling and decoupling an input DC voltage source, such as a battery, to a load, such as an integrated circuit. An output filter, typically including an inductor and a capacitor, is coupled between the input voltage source and the load to filter the output of the switch and thus provide the output DC voltage. A controller, such as a pulse width modulator or a pulse frequency modulator, controls the switch to maintain a substantially constant output DC voltage.

Double Diffused Drain (DDD) CMOS devices are commonly employed in switching regulators. DDD devices achieve high voltage tolerance through the introduction of a thick gate oxide and a resistive implant at the drain. The voltage rating of the device is determined by both the gate length and the spacing between the drain contact and the gate; thus establishing a trade-off between voltage rating and device performance.

As the complexity of integrated circuits and the power requirements for portable devices grow, there will be increasing pressure for switching regulators with extremely high efficiency. Therefore it would be advantageous to develop a switching regulator with diffused drains that operates with increased efficiency.

SUMMARY

In one aspect, the invention is directed to a transistor. The transistor has a source that includes a first impurity region with a first volume and a first surface area on a surface of the transistor. The transistor also has a drain that includes a second impurity region with a second volume and a second surface area on a surface of the transistor, a third impurity region with a third volume that overlaps and extends deeper than the second volume of the second impurity region, and a fourth impurity region with a fourth volume and a third surface area. The third surface area is located in the second surface area of the second impurity region. Additionally, the second and third impurity regions have a lower concentration of impurities than the fourth impurity region. The transistor also has a gate to control a depletion region between the source and the drain.

Implementations of the invention may include one or more of the following features. The third impurity region may be non-self aligning. The third impurity region may be self-aligning. The fourth impurity region may be formed entirely within the surface area of the third impurity region. The fourth impurity region may be formed outside the surface area of the third impurity region. The fourth impurity region may overlap the surface area of the third impurity region. An inner edge of the third impurity region may be between the inner edge of the second impurity region and the inner edge of the fourth impurity region. Inner edges of the third impurity region and the second impurity region may be approximately equal distances from the inner edge of the fourth impurity region. A surface area of the third impurity region may abut the gate. The second surface area of the second impurity region may abut the gate. The second impurity region may be wider than the third impurity region. The third impurity region may be wider than the second impurity region. The third impurity region may be formed entirely within the surface area of the second impurity region. The third impurity region may be positioned in a current path of the transistor.

Additional implementations of the invention may also include one or more of the following features. The third impurity region may have an approximately equal concentration of impurities as the second impurity region. The third impurity region may have a lower concentration of impurities than the second impurity region. The third impurity region may have a higher concentration of impurities than the second impurity region. The third impurity region may be positioned and may have a concentration sufficient to reduce resistive and capacitive power loss. The third impurity region may be positioned and may have a concentration sufficient to increase the maximum power density the transistor can sustain. The third impurity region may be positioned and may have a concentration sufficient to improve hot electron behavior and not affect the junction breakdown of the transistor. The third impurity region may be formed by CMOS processing techniques.

In another aspect, the invention is directed to a semiconductor device. The semiconductor device includes a semiconductor layer of a first conductivity type, an impurity well of a second conductivity type formed in a surface area of the semiconductor layer, and a first distributed device. The first distributed device has a drain, a source formed in a surface in the impurity well, and a gate to control a depletion region between the source and the drain. The semiconductor device also includes a second distributed device formed outside the surface area of the impurity well. The second distributed device has a source that includes a first impurity region with a first volume and a first surface area on a surface of the transistor. The second distributed device also has a drain that includes a second impurity region with a second volume and a second surface, a third impurity region with a third volume that overlaps and extends deeper than the second volume of the second impurity region, and a fourth impurity region with a fourth volume and a third surface area. The third surface area is located in the second surface area of the second impurity region. Additionally, the second and third impurity regions have a lower concentration of impurities than the fourth impurity region. The second distributed device also has a gate to control a depletion region between the source and the drain.

Implementations of the invention may include one or more of the following features. The drain may include a plurality of drains, the source may include a plurality of sources, and the gate may include a plurality of gates. The plurality of drains and sources may be arranged in a square fet implementation. The plurality of drains and sources may be arranged in a one-dimensional fingered array implementation.

Advantages of the invention may include the following. The transistor may have reduced resistive and capacitive loss and a reduced likelihood of hot electron behavior. Additionally, the transistor may also have a lower effective junction capacitance without affecting the junction breakdown voltage of the device. The device may have an increased maximum power density during high current transitions, thereby extending the safe operating region of the device. Moreover, the change may be compatible with standard processing techniques.

Other features and advantages of the invention will become apparent from the following description, including the drawings and the claims.

DETAILED DESCRIPTION

Although the switching regulator illustrated and discussed has a buck converter topology, the invention is also applicable to other voltage regulator topologies, such as a boost converter or a buck-boost converter, and to rf output amplifiers.

Figure 1:
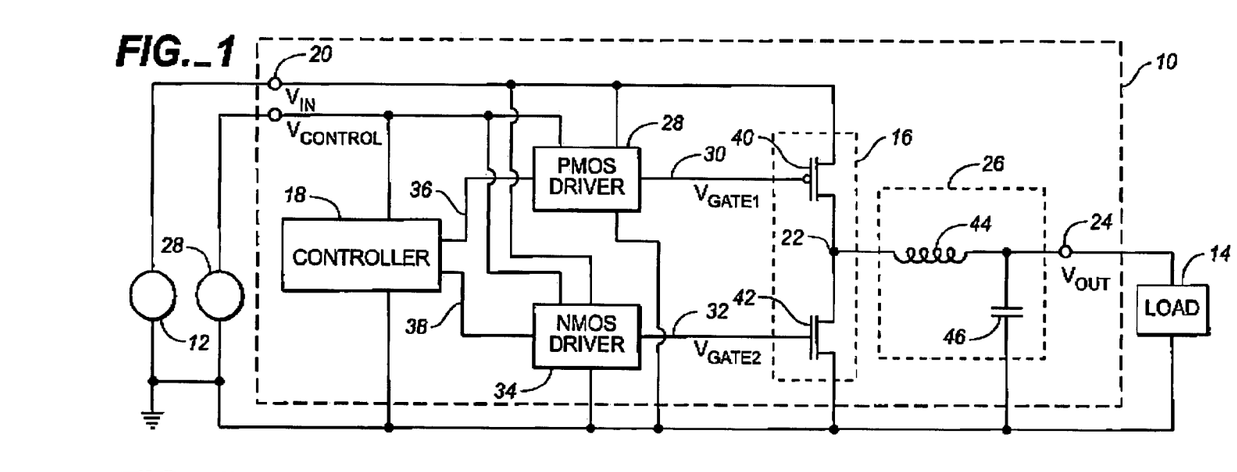
FIG. 1 is a block diagram of a buck switching regulator

Referring to FIG. 1, a switching regulator 10 is coupled to a first high DC input voltage source 12, such as a battery, by an input terminal 20. The switching regulator 10 is also coupled to a load 14, such as an integrated circuit, by an output terminal 24. The switching regulator 10 serves as a DC-to-DC converter between the input terminal 20 and the output terminal 24. The switching regulator 10 includes a switching circuit 16 which serves as a power switch for alternately coupling and decoupling the input terminal 20 to an intermediate terminal 22. The switching circuit 16 includes a rectifier, such as a switch or diode, coupling the intermediate terminal 22 to ground. Specifically, the switching circuit 16 may include a first transistor 40 (e.g., PMOS transistor) having a source connected to the input terminal 20 and a drain connected to the intermediate terminal 22 and a second transistor 42 (e.g. NMOS transistor) having a source connected to ground and a drain connected to the intermediate terminal 22. The first transistor 40 may be a Positive-Channel Metal Oxide Semiconductor (PMOS) transistor, whereas the second transistor 42 may be a Negative-Channel Metal Oxide Semiconductor (NMOS) transistor.

The intermediate terminal 22 is coupled to the output terminal 24 by an output filter 26. The output filter 26 converts the rectangular waveform of the intermediate voltage at the intermediate terminal 22 into a substantially DC output voltage at the output terminal 24. Specifically, in a buck-converter topology, the output filter 26 includes an inductor 44 connected between the intermediate terminal 22 and the output terminal 24 and a capacitor 46 connected in parallel with the load 14. The switching regulator also includes a controller 18, a PMOS driver 28 and an NMOS driver 34 for controlling the operation of the switching circuit 16. During a PMOS conduction period, the first transistor is closed, and the source 12 supplies energy to the load 14 and the inductor 44 via the first transistor 40. On the other hand, during an NMOS conduction period, the second transistor 42 is closed, and current flows through the second transistor 42 as energy is supplied by the inductor 44. The resulting output voltage Vout is a substantially DC voltage.

The switching regulator also includes a controller 18, a PMOS driver 80 and an NMOS driver 82 for controlling the operation of the switching circuit 16. A first control line 30 connects the PMOS transistor 40 to the PMOS driver 28, and a second control line 32 connects the NMOS transistor 42 to the NMOS driver 34. The PMOS and NMOS drivers are connected to the controller 18 by control lines 36 and 38, respectively. The controller 18 causes the switching circuit 16 to alternate between PMOS and NMOS conduction periods so as to generate an intermediate voltage Vint at the intermediate terminal 22 that has a rectangular waveform. The controller 16 can also include a feedback circuit (not shown), which measures the output voltage and the current passing through the output terminal. Although the controller 18 is typically a pulse width modulator, the invention is also applicable to other modulation schemes, such as pulse frequency modulation.

Figure 2:
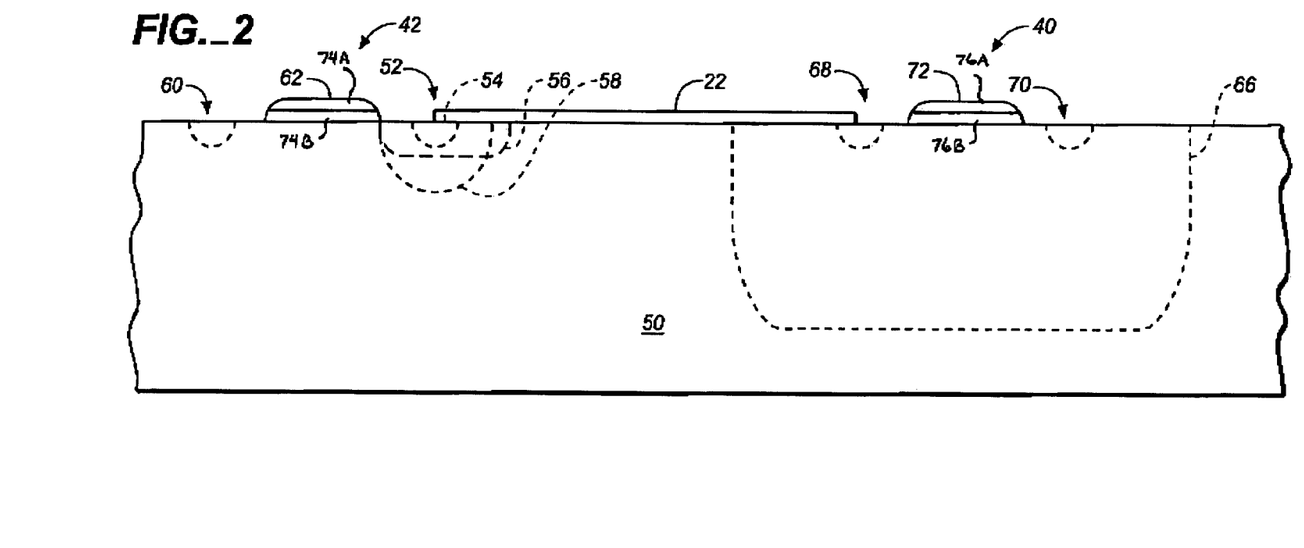
FIG. 2 is a schematic cross-sectional view of a switching circuit from the switching regulator of FIG. 1.

Referring to FIG. 2, the switching circuit 16 can be fabricated on a p-type substrate 50. The NMOS transistor 42 includes a drain region 52 with an n-doped n+ region 54, an n-doped deep drain (NDD) 56, and an n-type well (nwell) 58. Additionally, the NMOS transistor 42 includes an n-doped source region 60 and a gate 62. The gate 62 includes a conductive layer 74A and a gate oxide layer 74B. The PMOS transistor 40 includes an n-type well 66, a p-doped drain region 68, a p-doped source region 70, and a gate 72. The Rate 72 includes a conductive layer 76A and a gate oxide layer 76B. Of course, the switching circuit could be fabricated on an n-type substrate, in which case the NMOS transistor would include a p-doped well and the PMOS transistor would include the modified drain.

Figure 3:
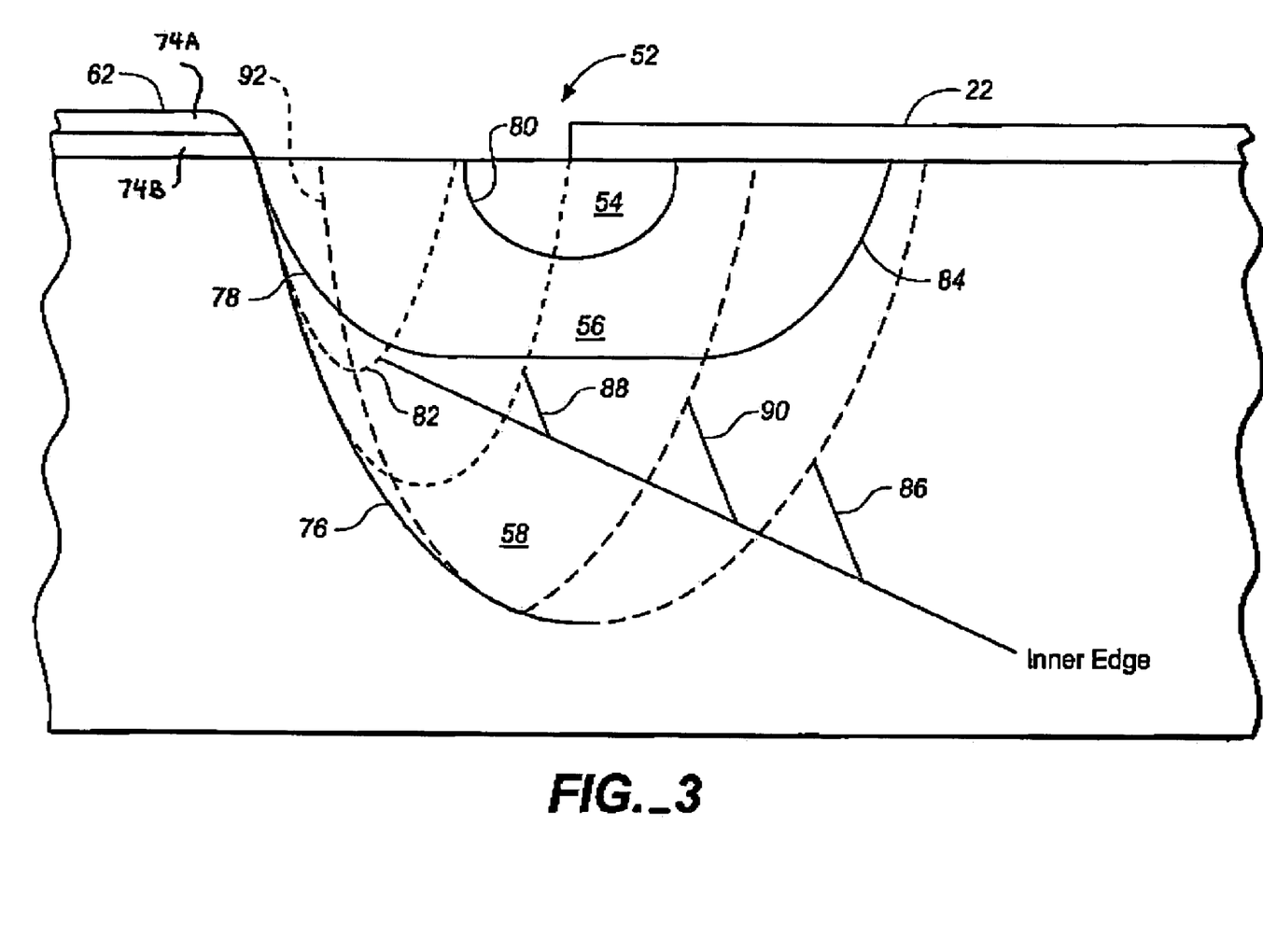
FIG. 3 is a schematic cross-sectional view of an NMOS drain modified with an nwell.

Referring to FIG. 3, the n+ region 54 in the drain region 52 is located within the NDD 56, and the nwell 58 overlaps and extends deeper than the NDD 56. The n+ region, the NDD, and the nwell of the NMOS transistor are volumes with inner edges defined as closer to the NMOS gate and outer edges defined as farther from the gate. Ideally, an inner edge 78 of the NDD abuts an edge of the gate 62, and an inner edge 76 of the nwell 58 is coterminous with the inner edge 78 of the NDD 56. However, the coterminous alignment of the inner edge 76 of the nwell 58 is not required if the inner edge 76 is in the current flow between the inner edge 78 of the NDD 56 and an inner edge 80 of the n+ region 54. For example, an inner edge 92 of the nwell 58 can be positioned between the inner edge 80 of the n+ region 54 and the inner edge 78 of the NDD 56. The nwell 58 can have an outer edge 82 that is closer to the gate than the inner edge 80 of the n+ region 54, or an outer edge 86 can extend past an outer edge 84 of the NDD 56, or it can be anywhere in between (such as the positions indicated by phantom lines 88 and 90).

Figure 4:
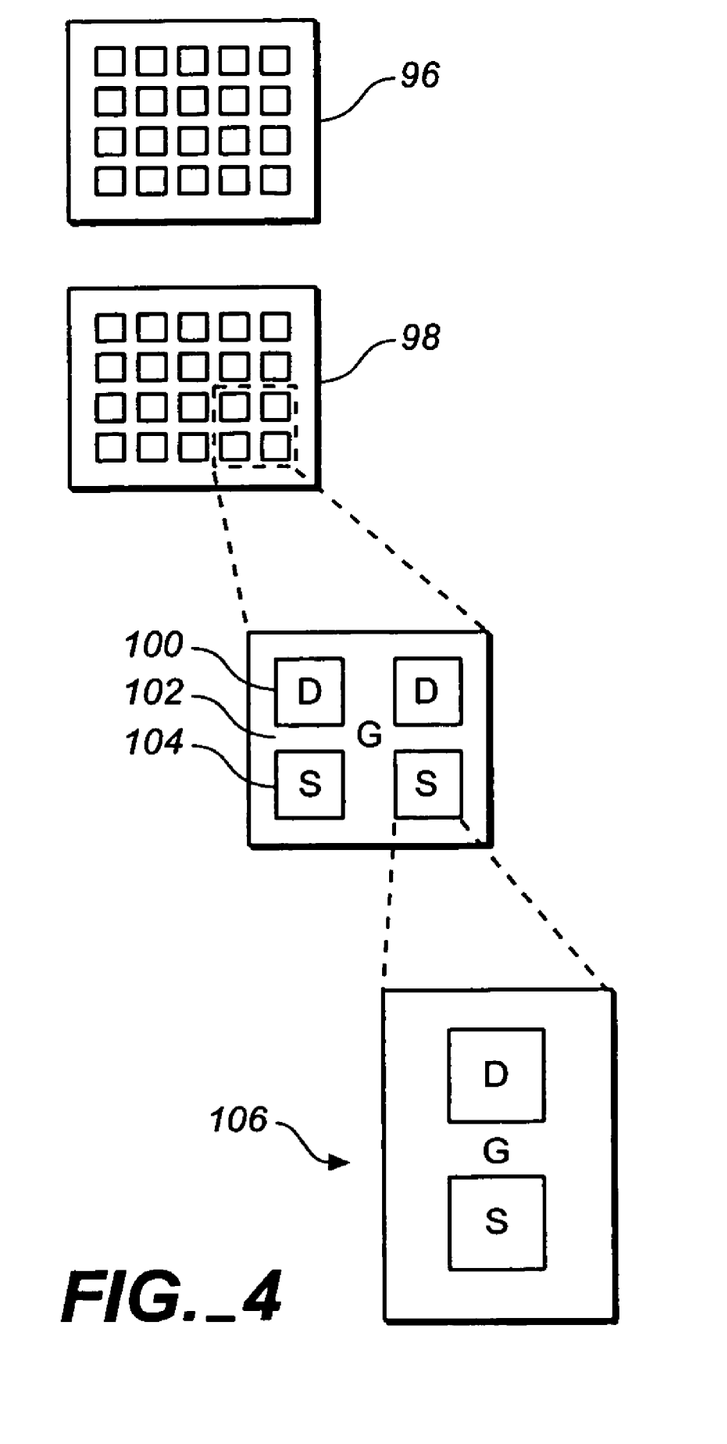
FIG. 4 is a block diagram of the switching circuit of FIG. 1 implemented with large distributed devices.

Referring to FIG. 4, the switching circuit 16 can be implemented with two large distributed devices. The top distributed device 96 of the switching circuit 16 consists of PMOS transistors, while the lower distributed device 98 consists of NMOS transistors. Both distributed devices include individual transistors, which can be implemented following a fingered or two-dimensional square fet approach. In the latter approach, the lower distributed device 98 illustrates how this implementation is achieved with the alternating placement of a drain 100 and then a source 104 separated by a gate 102 with the pattern repeated. The combination of a drain, a source, and a gate, in turn, forms an individual NMOS transistor 106. Again, the top distributed device 96 is implemented in the same way using PMOS transistors.

Figure 5A:
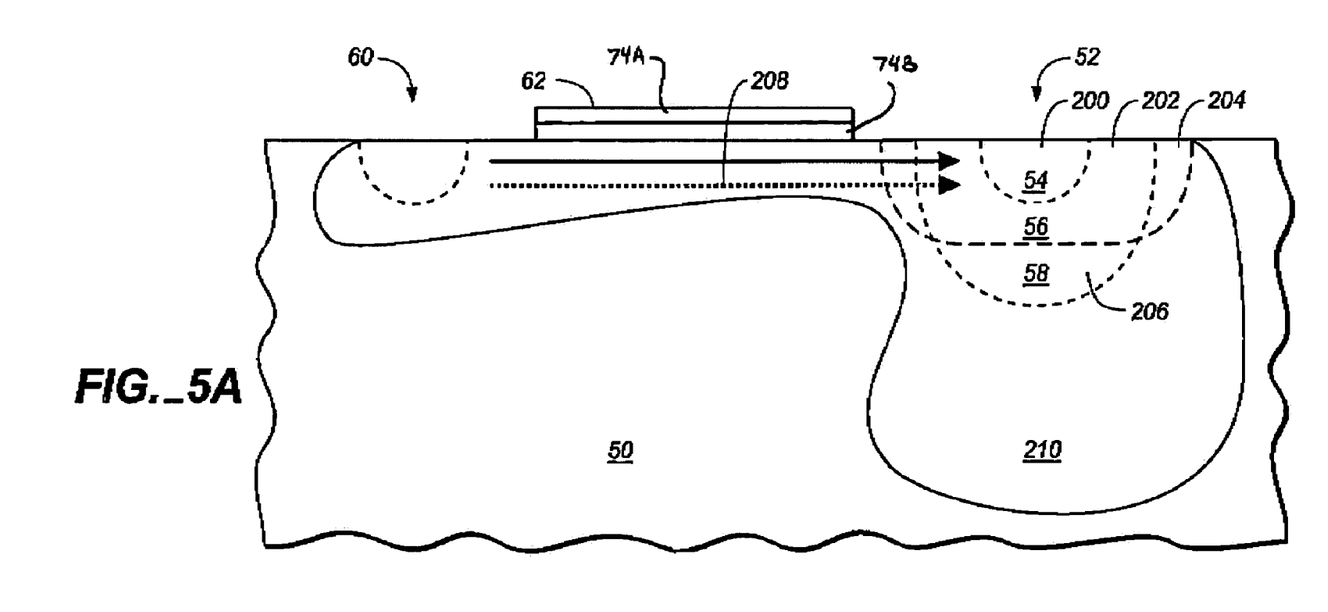
FIGS. 5A and 5B are a schematic cross-sectional view of an NMOS device and a three-dimensional view of the surfaces areas of the modified NMOS drain, respectively.

Referring to FIG. 5A, the nwell 58, the NDD 56, and the n+ region 54 are volumes composed of doped material. Both the NDD and the nwell have a lower concentration of impurities than the n+ region. Portions at which these volumes overlap have a higher doping concentration than the individual volumes have separately. A portion 200 that contains the overlapping volumes of the n+ region 54, the NDD 56, and the nwell 58 has the highest doping concentration of all the overlapping volume portions. A portion 202 that contains the overlapping volumes of the NDD 56 and the nwell 58, but not the n+ region 54, is less concentrated than the portion labeled 200. A portion 204 that only includes a part of the NDD 56 does not overlap with either the n+ region 54 or the nwell 58 volumes. Consequently, this portion 204 has a lower doping concentration than either portion labeled 200 or 202 because it does not have multiple overlapping doped volumes. Likewise, a portion 206 of the nwell 58 that extends beyond the NDD 56 has a lower doping concentration than either portion 200 or 202. Although FIG. 5A shows possible portions of increased doping concentration, the n+ region 58, the NDD 56, and the nwell 54 volumes can be positioned to produce different overlapping portions. For example, the portion 204 would not exist if the volume 58 of the nwell entirely overlapped the volume 56 of the NDD.

The NMOS transistor also has a depletion region 210. The depletion region 210 extends from the source region 60 to the drain region 52. As the depletion region 210 approaches the drain region 52, it becomes narrower. However, after the depletion region 210 reaches the drain region 52, it expands to surround the outer boundaries of the drain region formed by the nwell 58 and the NDD 56.

Figure 5B:
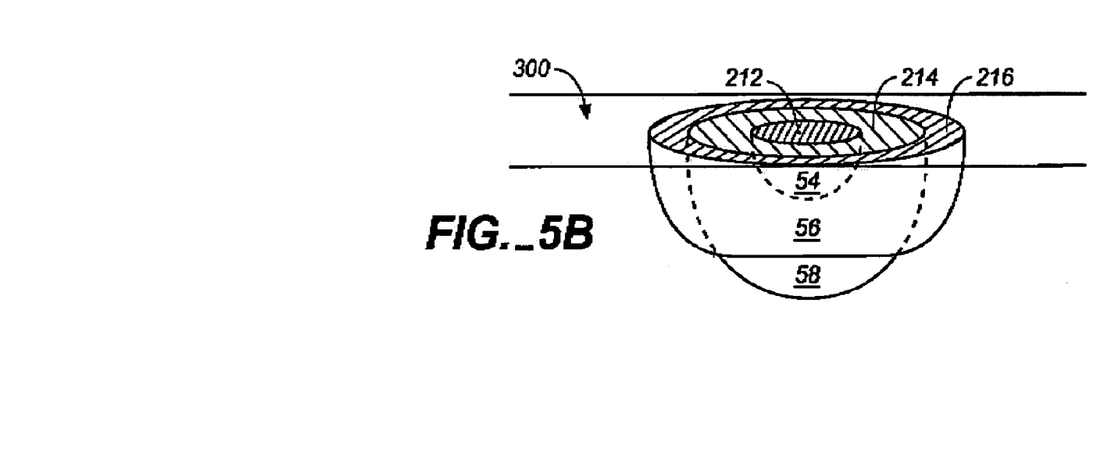

Referring to FIG. 5B, the volumes of the NDD 56, the n+ region 54, and the nwell 58 (216, 212, and 214, respectively) can have a surface areas on the surface 300 of the device. The NDD 56 has a surface area 216. The n+ region 54 has a surface area 212 located within the surface area 216 of the NDD. The nwell may have a surface area 214 located within the surface area 216 of the NDD, and the surface area 212 of the n+ region may be located within the surface area 214 of the nwell. Although it is not shown in FIG. 5B, the nwell may also have a surface area that does not contain the surface area of the n+ region or the nwell may have a surface area that only contains a part of the surface area of the n+ region. The surface area of the nwell may also contain the entire surface area of the NDD or only a part of the surface area of the NDD. Furthermore, it is not necessary for the nwell to have a surface area on the surface of the transistor. Instead, the nwell may be located completely below the surface of the transistor. As shown in FIG. 5B, the volume of n+ region 54 is not coextensive with an overlap region formed by an overlap between the volumes of nwell 58 and NDD 56. Further, the surface area of n+ region 54 is not coextensive with a surface area of NDD 56. Also, as shown in FIG. 5B, n+ region 54 does not share a lower boundary with a lower boundary of the overlap region formed by the overlap between the volumes of nwell 58 and NDD 56, in which the lower boundary of the n+ region 54 and the lower boundary of the overlap region are each below the surface 300 of the device.

Including the nwell in the NMOS drain provides several potential advantages. For example, the increased doping concentration provided by the nwell can create a minor parallel current path 208 (depicted in FIG. 5A). This parallel current path reduces resistive loss. Also, because the insertion of the nwell decreases the resistance of the drain region, the n+ region may be placed farther from the gate than a drain region without an nwell without sacrificing current conductance. The increased distance between the gate and the n+ region reduces the likelihood of hot electron behavior thereby improving the lifetime of the transistor. Additionally, the more lightly doped portion of the nwell that extends beyond the NDD increases the depletion region in the drain region, thus serving to lower the effective junction capacitance. The addition of the nwell, however, does not affect the junction breakdown voltage of the device.

Implanting the nwell also has the advantage of decreasing the substrate current when the device is heavily operated in the saturation region. This, in turn, serves to increase the snapback voltage. In addition to increasing the snapback voltage, device robustness is also improved by increasing the maximum power density the device can sustain during high current transients. Moreover, the increased snapback voltage and substrate current capability extend the power density and operating range in the saturated region when the device is used as an amplifier.

Figure 6:
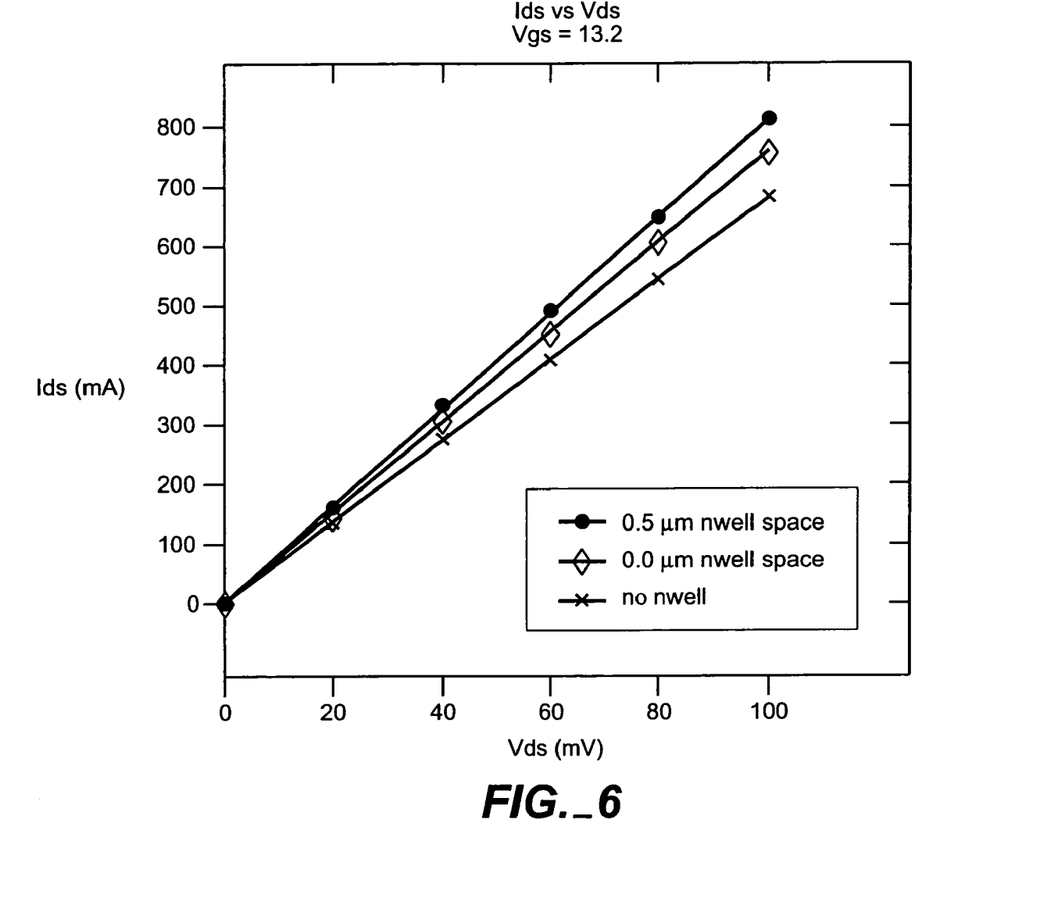
FIG. 6 is a graph showing the current conductance of modified and unmodified NMOS transistors as a function of the voltage difference between the drain and the source.

FIG. 6 shows a graph of current conductance as a function of the voltage difference between the drain and the source. As shown, the conductance increases inversely proportional to the nwell-to-gate spacing. Furthermore, the mere addition of the nwell, even at 0.5 µm spacing, increases the conductance when compared to a device without the nwell.

Figure 7A:
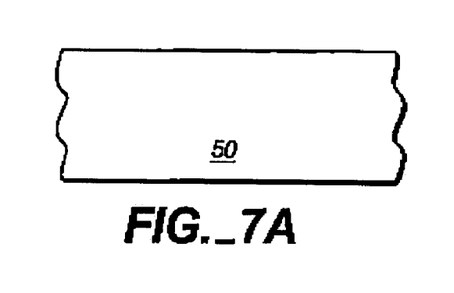
FIGS. 7A, 7B, 7C, 7D, and 7E illustrate the process of manufacturing a semiconductor device with both NMOS and PMOS transistors Like reference symbols in the various drawings indicate like elements.
Figure 7B:
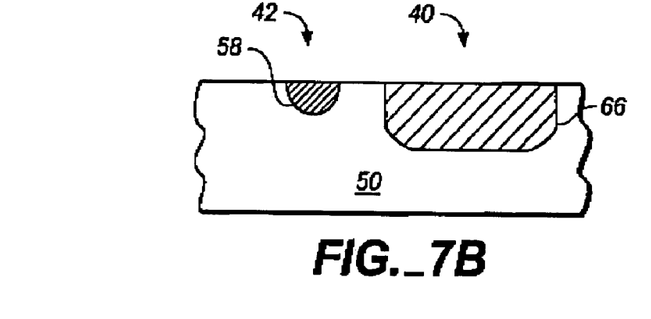
Figure 7C:
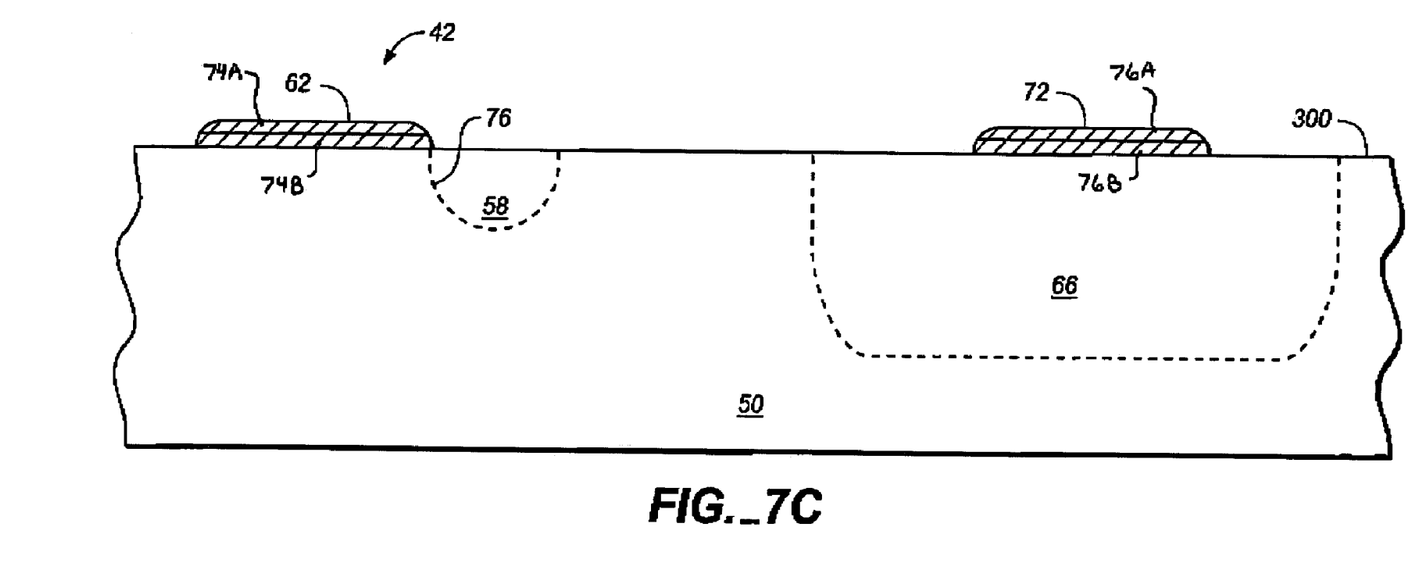
Figure 7D:
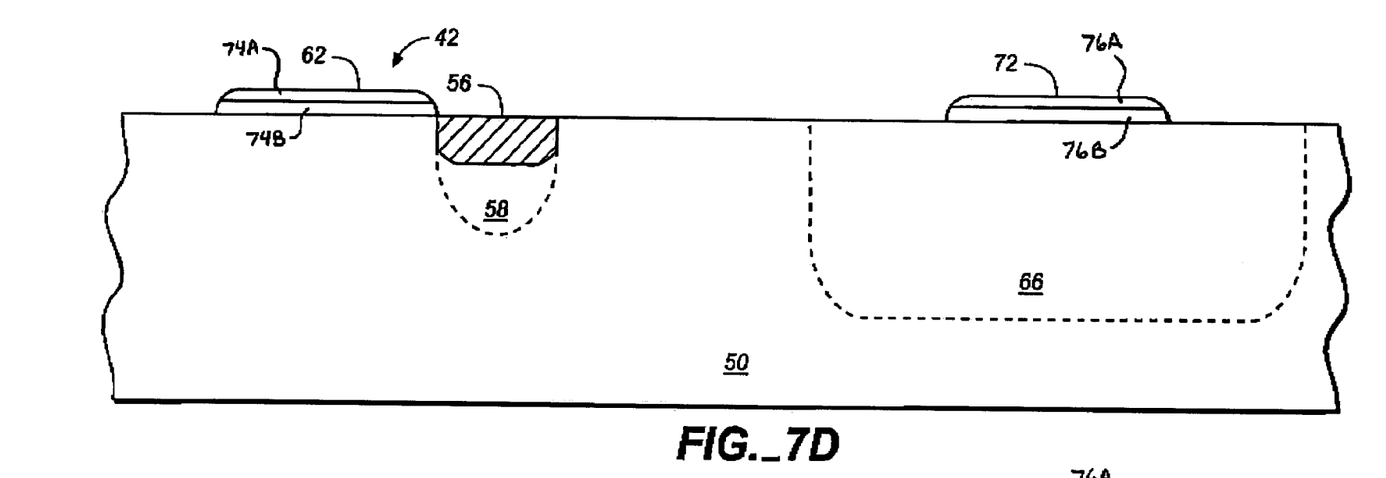
Figure 7E:
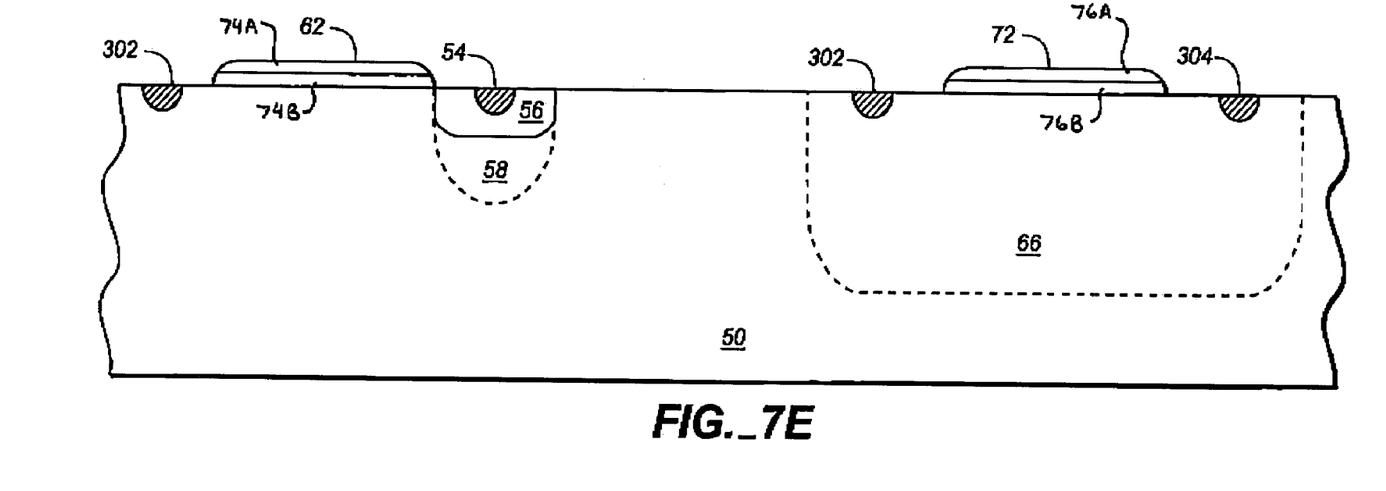

FIGS. 7A through 7E illustrate the process of manufacturing a semiconductor device with both NMOS and PMOS transistors. Initially, a semiconductor layer consisting of the p-type substrate 50 is formed (FIG. 7A). The large n-type well 66 for the PMOS transistor 40 and the smaller nwell 58 for the NMOS drain are then formed (FIG. 7B). Both the n-type well 60 and the smaller nwell 58 are implanted in the p-type substrate 50. The smaller nwell may be non-self-aligned or self-aligned. Next, the NMOS gate 62 is positioned on a surface 300 of the device near the inner edge 76 of the nwell (FIG. 7C). The NMOS gate 62 includes a conductive layer 74A and a gate oxide layer 74B. Here the PMOS gate 72 is formed on the surface of the device over the large n-type well 66. The PMOS gate 72 includes a conductive layer 76A and a gate oxide layer 76B. Following this, the NDD 56 is inserted. The NDD 56 is only inserted in the NMOS transistor 42, and it overlaps the inserted nwell 58 in the drain (FIG. 7D). Next, the n+ regions and the p+ regions are inserted. The p+ regions are inserted in the PMOS transistor 40 at both the drain and the source and labeled 302 and 304, respectively. Similarly, n+ regions are inserted in the NMOS transistor at both the drain and the source and labeled 306 and 54, respectively. The n+ region 54 in the drain overlaps both the NDD 56 and the nwell 58 as shown in FIG. 7E. Although the above process uses n-type dopings on a p-type substrate, the process could use p-type dopings on an n-type substrate.

Of course the ordering of the figures is not meant to imply the method must be exclusively performed in this sequence. For example, the formation of the gates in FIG. 7C could take place before the insertion of the nwell in FIG. 7B or at a time after the insertion of the NDD in FIG. 7D. Likewise, the other elements do not have to be formed in a particular sequence. Additionally, the use of the nwell native to a CMOS process greatly simplifies the device fabrication.

The invention has been described in terms of particular embodiments. Other embodiments are within the scope of the following claims.

What is claimed is:

1. A transistor comprising:
    a drain including:
        a first impurity region of a first conductivity type having a first volume and a first surface area on a surface of the transistor,
        a second impurity region of the first conductivity type with a lower concentration of impurities than the first impurity region, the second impurity region having a second volume and a second surface area on the surface of the transistor, wherein the second volume surrounds and abuts the first volume and extends below the first volume, and the second surface area is adjacent to the first surface area,
        a third impurity region of the first conductivity type with a lower concentration of impurities than the second impurity region, the third impurity region having a third volume and a third surface area on the surface of the transistor, wherein the third volume surrounds and abuts the second volume, and has a lower boundary that is vertically aligned with a lower boundary of the second volume, and wherein the third surface area is adjacent to the second surface area, and
        a fourth impurity region of the first conductivity type with a lower concentration of impurities than the second impurity region, the fourth impurity region having a fourth volume, wherein the fourth volume extends below the second volume and has an upper boundary that abuts the lower boundary of the second volume and an outer boundary that is laterally aligned with an outer boundary of the second volume;
    a source including a fifth impurity region with a fifth volume and a fifth surface area on the surface of the transistor; and
    a gate to control a depletion region between the source and the drain,
    wherein the fourth impurity region has a lower concentration of impurities than the third impurity region.

2. The transistor of claim 1, wherein the third impurity region is not self-aligned with respect to the gate.

3. The transistor of claim 1, wherein the third impurity region is self-aligned with respect to the gate.

4. The transistor of claim 1, wherein the second surface area surrounds the first surface area.

5. The transistor of claim 1, wherein the third surface area surrounds the second surface area.

6. The transistor of claim 1, wherein the third surface area of the third impurity region abuts a gate oxide layer corresponding to the gate.

7. The transistor of claim 1, wherein the fourth impurity region is positioned and has a concentration sufficient to reduce resistive and capacitive power loss.

8. The transistor of claim 1, wherein the fourth impurity region is positioned and has a concentration sufficient to increase the maximum power density the transistor can sustain.

9. The transistor of claim 1, wherein the fourth impurity region is positioned and has a concentration sufficient to improve hot electron behavior and not affect the junction breakdown of the transistor.

10. The transistor of claim 1, wherein the second impurity region and the fourth impurity region are formed by one or more CMOS processing techniques.

11. A semiconductor device, comprising:
    a semiconductor layer of a first conductivity type;
    an impurity well of a second conductivity type formed in a surface area of the semiconductor layer;
    a first distributed device having a drain and a source formed in a surface in the impurity well and a gate to control a depletion region between the source and the drain; and
    a second distributed device formed outside the surface area of the impurity well including:
        a drain including:
            a first impurity region of a second conductivity type having a first volume and a first surface area on a surface of the transistor,
            a second impurity region of the second conductivity type with a lower concentration of impurities than the first impurity region, the second impurity region having a second volume and a second surface area on the surface of the transistor, wherein the second volume surrounds and abuts the first volume and extends below the first volume, and the second surface area is adjacent to the first surface area,
            a third impurity region of the second conductivity type with a lower concentration of impurities than the second impurity region, the third impurity region having a third volume and a third surface area on the surface of the transistor, wherein the third volume surrounds and abuts the second volume, and has a lower boundary that is vertically aligned with a lower boundary of the second volume, and wherein the third surface area is adjacent to the second surface area, and
            a fourth impurity region of the second (conductivity type with a lower concentration of impurities than the second impurity region, the fourth impurity region having a fourth volume, wherein the fourth volume extends below the second volume and has an upper boundary that abuts the lower boundary of the second volume and an outer boundary that is laterally aligned with an outer boundary of the second volume;
        a source including a fifth impurity region with a fifth volume and a fifth surface area on the surface of the transistor;
        a gate to control a depletion region between the source and the drain;
    wherein the drain of the first distributed device and the drain of the second distributed device each includes a plurality of drains,
    wherein the source of the first distributed device and the source of the second distributed device each includes a plurality of sources,
    wherein the gate of the first distributed device and the gate of the second distributed device each includes a plurality of gates, and
    wherein the fourth impurity region has a lower concentration of impurities than the third impurity region.

12. The semiconductor device of claim 11, wherein the plurality of drains and sources are arranged in a square fet implementation.

13. The semiconductor device of claim 11, wherein the plurality of drains and sources are arranged in a fingered array implementation.

14. The semiconductor device of claim 11, wherein the third impurity region is not self-aligned with respect to the gate.

15. The semiconductor device of claim 11, wherein the third impurity region is self-aligned with respect to the gate.

16. The semiconductor device of claim 11, wherein the second surface area surrounds the first surface area.

17. The semiconductor device of claim 11, wherein the third surface area surrounds the second surface area.

18. The semiconductor device of claim 11, wherein the third surface area of the third impurity region abuts a gate oxide layer corresponding to the gate.

* * * * *

UNITED STATES PATENT AND TRADEMARK OFFICE
CERTIFICATE OF CORRECTION

PATENT NO. : 7,615,822 B1 Page 1 of 1
APPLICATION NO. : 10/327794
DATED : November 10, 2009
INVENTOR(S) : Marco A. Zuniga It is certified that error appears in the above-identified patent and that said Letters Patent is hereby corrected as shown below:

Column 8, in Claim 11 (at Line 24), delete "(conductivity" and insert --conductivity--, therefor.

Signed and Sealed this

Twenty-third Day of March, 2010

David J. Kappos
*Director of the United States Patent and Trademark Office*